United States Patent
Malek et al.

(10) Patent No.: US 9,225,115 B2
(45) Date of Patent: Dec. 29, 2015

(54) RETENTION KEY LOCK FOR BOARD-TO-BOARD CONNECTORS

(71) Applicant: Apple Inc., Cupertino, CA (US)

(72) Inventors: Shayan Malek, San Jose, CA (US); Astoush Y. Shukla, Cupertino, CA (US); Michael B. Wittenberg, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 125 days.

(21) Appl. No.: 13/913,337

(22) Filed: Jun. 7, 2013

(65) Prior Publication Data

US 2014/0113475 A1    Apr. 24, 2014

Related U.S. Application Data

(60) Provisional application No. 61/717,046, filed on Oct. 22, 2012.

(51) Int. Cl.
*H01R 13/62* (2006.01)
*H01R 13/639* (2006.01)
*H01R 43/26* (2006.01)
*H01R 12/70* (2011.01)
*H01R 12/79* (2011.01)
*H05K 3/36* (2006.01)

(52) U.S. Cl.
CPC .......... *H01R 13/639* (2013.01); *H01R 12/7047* (2013.01); *H01R 12/79* (2013.01); *H01R 43/26* (2013.01); *H05K 3/365* (2013.01); *H05K 2201/09063* (2013.01); *H05K 2203/167* (2013.01); *Y10T 29/49126* (2013.01)

(58) Field of Classification Search
CPC .. H01R 12/7047; H01R 13/639; H01R 43/26; H01R 12/523; H01R 12/714; Y10T 29/49126
USPC ........................................................ 439/306
See application file for complete search history.

(56) References Cited

U.S. PATENT DOCUMENTS

| | | | |
|---|---|---|---|
| 3,662,321 A | 5/1972 | Bury | |
| 3,721,940 A | 3/1973 | Michel et al. | |
| 3,796,986 A | 3/1974 | Tamburro | |
| 4,012,093 A | 3/1977 | Crane | |
| 4,057,311 A | 11/1977 | Evans | |
| 4,416,496 A | 11/1983 | Brefka | |
| 4,538,865 A | 9/1985 | Wakabayashi et al. | |
| 4,587,377 A | 5/1986 | Rodseth | |
| 4,636,018 A | 1/1987 | Stillie | |
| 4,647,125 A | 3/1987 | Landi et al. | |
| 4,693,529 A | 9/1987 | Stillie | |
| 4,695,258 A | 9/1987 | Hanson et al. | |
| 4,913,656 A | 4/1990 | Gordon et al. | |
| 4,929,185 A | 5/1990 | Wong et al. | |
| 4,948,374 A | 8/1990 | Carter | |

(Continued)

*Primary Examiner* — Jean F Duverne
(74) *Attorney, Agent, or Firm* — Kilpatrick Townsend & Stockton LLP (57) ABSTRACT

Board-to-board connectors that consume a minimal amount of board area, are simple to assemble, and provide a clear indication that a proper connection has been made. One example may consume minimal area, since only a retention key and slots in boards and connectors are needed. The connector may be simple to assemble since it may be as simple as stacking components, pushing down, and turning a retention key. Further, a first and a first line on a key and a cowling may be aligned after assembly to provide a clear indication that the connector has been properly assembled.

22 Claims, 4 Drawing Sheets

(56) References Cited

U.S. PATENT DOCUMENTS

| | | | |
|---|---|---|---|
| 4,998,887 A | 3/1991 | Kaufman et al. | |
| 5,051,366 A | 9/1991 | Anderson et al. | |
| 5,152,694 A * | 10/1992 | Bargain | 439/66 |
| 5,160,269 A | 11/1992 | Fox, Jr. et al. | |
| 5,219,293 A | 6/1993 | Imamura | |
| 5,221,209 A * | 6/1993 | D'Amico | 439/71 |
| 5,252,079 A * | 10/1993 | Grabbe | 439/70 |
| 5,259,781 A | 11/1993 | Baumberger et al. | |
| 5,295,838 A | 3/1994 | Walen et al. | |
| 5,384,433 A * | 1/1995 | Osann et al. | 174/250 |
| 5,525,064 A | 6/1996 | Mowry | |
| 5,575,686 A | 11/1996 | Noschese | |
| 5,685,073 A | 11/1997 | Estes et al. | |
| 5,730,619 A | 3/1998 | Hamlin | |
| 5,871,362 A | 2/1999 | Campbell et al. | |
| 6,017,244 A | 1/2000 | Daane | |
| 6,039,581 A | 3/2000 | DiMarco | |
| 6,077,090 A | 6/2000 | Campbell et al. | |
| 6,257,918 B1 | 7/2001 | Yamamoto | |
| 6,309,223 B1 | 10/2001 | Wolfe | |
| 6,368,117 B1 | 4/2002 | Taylor | |
| 6,409,526 B1 | 6/2002 | Malone et al. | |
| 6,425,768 B1 | 7/2002 | Taylor | |
| 6,431,879 B2 | 8/2002 | Brekosky et al. | |
| 6,520,789 B2 | 2/2003 | Daugherty, Jr. et al. | |
| 6,579,104 B1 | 6/2003 | Bishop et al. | |
| 6,614,659 B2 | 9/2003 | Feigenbaum et al. | |
| 6,634,890 B2 * | 10/2003 | Peterson et al. | 439/67 |
| 6,822,466 B1 | 11/2004 | Holcombe et al. | |
| 6,843,629 B2 | 1/2005 | Farral et al. | |
| 6,863,543 B2 | 3/2005 | Lang et al. | |
| 6,869,291 B2 | 3/2005 | Norland et al. | |
| 6,926,537 B1 | 8/2005 | Auchincloss et al. | |
| 7,046,020 B2 | 5/2006 | LaMeres et al. | |
| 7,223,106 B2 | 5/2007 | Nakajima et al. | |
| 7,323,892 B1 | 1/2008 | LaMeres et al. | |
| 7,347,719 B2 | 3/2008 | Geibel et al. | |
| 7,407,408 B1 | 8/2008 | Taylor | |
| 7,438,582 B2 | 10/2008 | Taylor | |
| 7,465,195 B1 | 12/2008 | Kerrigan et al. | |
| 8,251,712 B2 | 8/2012 | Cheng | |
| 8,758,067 B2 * | 6/2014 | Rathburn | 439/700 |
| 2002/0142629 A1 | 10/2002 | Zaderej et al. | |
| 2003/0113183 A1 | 6/2003 | McAfee | |
| 2004/0258500 A1 | 12/2004 | Ireland | |
| 2006/0216960 A1 | 9/2006 | Chang | |
| 2006/0264096 A1 | 11/2006 | Johnson | |
| 2010/0093193 A1 * | 4/2010 | Trout et al. | 439/74 |
| 2014/0120788 A1 | 5/2014 | Kodaira et al. | |
| 2014/0148021 A1 | 5/2014 | Hsu | |
| 2014/0302692 A1 | 10/2014 | Raff et al. | |

* cited by examiner

RETENTION KEY LOCK FOR BOARD-TO-BOARD CONNECTORS

CROSS-REFERENCES TO RELATED APPLICATIONS

This application is a non-provisional of U.S. provisional patent application No. 61/717,046, filed Oct. 22, 2012, which is incorporated by reference.

BACKGROUND

Electronic devices have become ubiquitous the past several years. The numbers and types of portable computing devices, tablets, desktops, and all-in-one computers, cell phones, smart phones, and media phones, storage devices, portable media players, navigation systems, monitors and other devices has increased tremendously, and this increase shows no signs of abating.

These devices may include several electronic components such as screens, memories, processors, and the like. These devices may be located on a board, such as printed circuit boards, flexible circuit boards, or other appropriate substrates.

Often, these boards need to be connected to each other. Unfortunately, these connections may have costs associated with them. One such cost may be the area consumed on the boards to be joined. Conventional standoffs and other structures may consume board area, thereby either decreasing the amount of functionality that may be included in the device or increasing the size of the device.

Another cost associated with these board-to-board connectors arises from the complexity of the assembly process. If a connector is difficult to assemble, it may cause operator confusion and slow an assembly line. This may lead to operator dissatisfaction and reduced throughput.

A related cost arises from the decrease in yields and increase the number of devices to be reworked or scrapped due to this operator confusion and dissatisfaction. Still another cost may arise from confusion caused by a lack of a clear indication that a connection has been properly formed. This may lead to having to more closely inspect devices to ensure that the connections have been properly made.

Thus, what is needed are board-to-board connectors that consume a minimal amount of board area, are simple to assemble, and provide a clear indication that a proper connection has been made.

SUMMARY

Accordingly, embodiments of the present invention may provide board-to-board connectors that consume a minimal amount of board area, are simple to assemble, and provide a clear indication that a proper connection has been made.

An illustrative embodiment of the present invention may provide a retention key formed to fit through slots in two or more boards and joining connector plugs and receptacles. After the retention key has been fit through the slots, a force may be applied to the retention key (or other connector piece) to push a locking tail on the retention key below the bottommost board to be connected. A pliable layer, such as a piece of foam, may be included as part of the connector. This pliable layer may compress due to the applied force. The retention key may then be rotated such that the locking tail is at an angle of approximately 90 degrees to the slots. The retained compression force of the pliable layer may keep the retention key and prevent it from rotating back. A notch in a bottom surface of the bottom board may also help keep the retention key in place.

A stiffening layer, such as a metal cowling, may be placed over the pliable layer and below a head of the retention key. The force to compress the pliable layer may then be applied to either or both the head of the retention key or the cowling.

A first grove may be laser etched, printed, or otherwise placed on the retention key head and a first grove may be similarly laser etched, printed, or otherwise placed on the first stiffening layer. As retention key and locking tail is turned at an angle of approximately 90 degrees to the slots, the first grove may approximately align with the first grove.

Thus, embodiments of the present invention may provide a connector assembly that consumes minimal area, since only a retention key and slots are needed. The connector may be simple to assemble since it may be as simple as stacking components, pushing down, and turning the retention key. Further, the first grove on the key and the first line on the cowling may provide a clear indication that the connector has been properly assembled.

An illustrative embodiment of the present invention may provide an apparatus to connect a first board to a second board. The apparatus may include the second board having a slot, a receptacle on the second board having a slot aligned with the slot in the second board, a plug connected to the first board, the plug inserted into the receptacle, the plug having a slot aligned with the slot in the receptacle, a first pliable layer located on the plug and having a slot aligned with the slot in the plug, a first stiffening piece located on the pliable layer and having a slot aligned the slot in the first pliable layer, and a retention key. The retention key may have a head in contact with the first stiffening piece, a shaft through the slots in the second board, receptacle, plug, first pliable layer, and first stiffening piece, and a locking tail below the second board and at an angle to the slot in the second board.

An illustrative embodiment of the present invention may provide a method of manufacturing an apparatus to connect a first board to a second board. This method may include providing a slot in the second board, attaching a receptacle to the second board, the receptacle having a slot aligned with the slot in the second board, connecting a plug to the first board, inserting the plug into the receptacle, the plug having a slot aligned with the slot in the receptacle, placing a first pliable layer on the plug, the first pliable layer having a slot aligned with the slot in the plug, placing a first stiffening piece on the pliable layer, the first stiffening layer having a slot aligned the slot in the first pliable layer, and inserting a retention key having a head, a shaft, and a locking tail. The retention key may be inserted by aligning the locking tail with the slots in the second board, receptacle, plug, first pliable layer, and first stiffening piece, lowering the retention key until the head meets the first stiffening layer, compressing the pliable layer until the locking tail emerges from a bottom of the second board, and turning the retention key.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
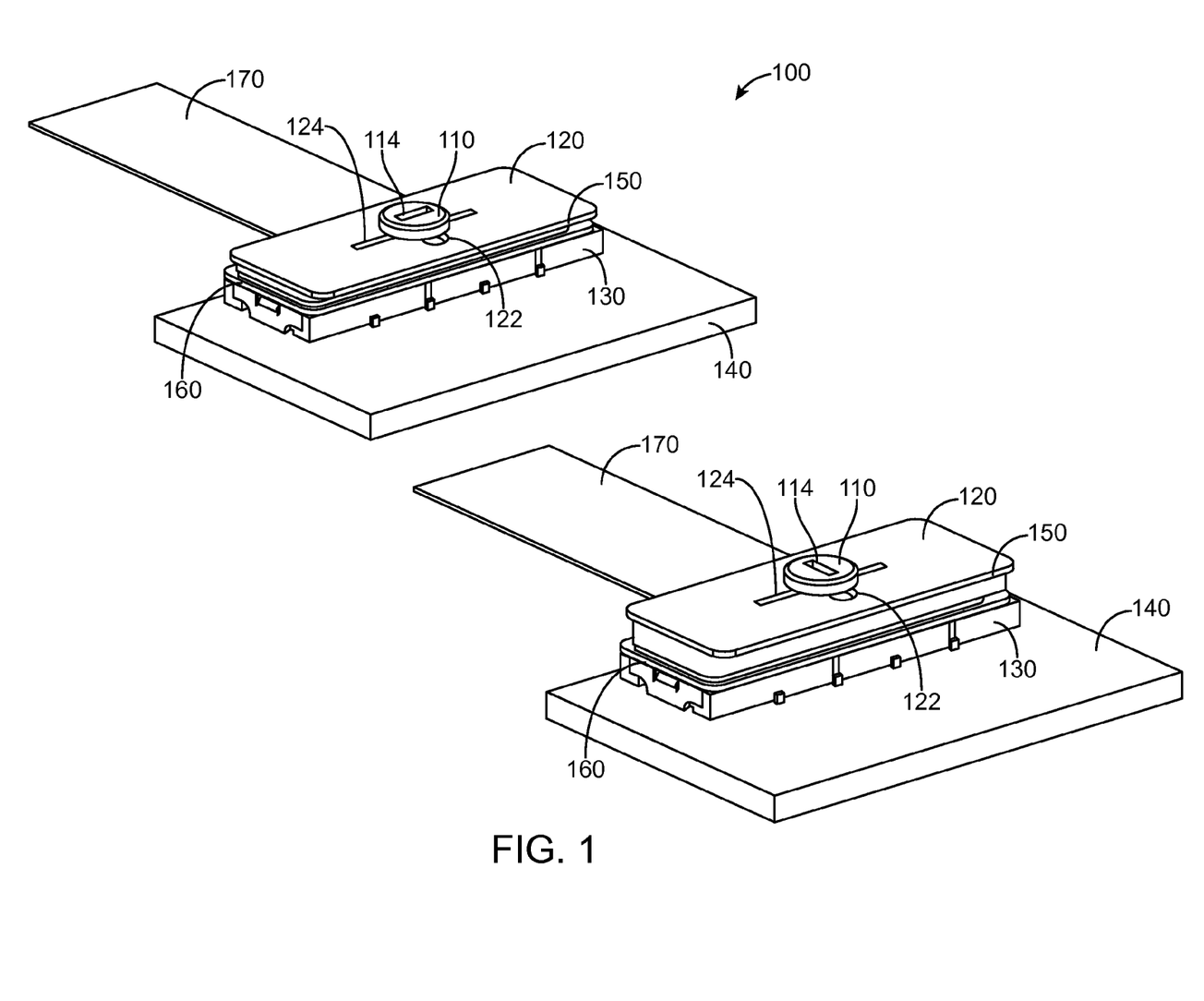
FIG. 1 illustrates a connector apparatus according to an embodiment of the present invention.

FIG. 1 illustrates a connector apparatus according to an embodiment of the present invention. This figure, as with the other included figures, is shown for illustrative purposes and does not limit either the embodiments of the present invention or the pending claims.

This figure shows connector assembly 100 having a retention key 110 shown in both the locked and unlocked states. Connector assembly 100 may include retention key 110, stiffening layer or cowling 120, pliable layer, 150 plug 160, flexible circuit board 170, receptacle 130, and printed circuit board 140.

Groove 114 may be laser etched or otherwise placed in a head of retention key 110. Similarly, line 124 may be laser etched, printed, or otherwise placed on cowling 120. When retention key 110 is inserted into connector 100, grove 114 and line 124 may be approximately at right angles to each other. To lock retention key 110, it may be turned approximately 90 degrees such that groove 114 is at least approximately aligned with line 124 on the cowling 120. The alignment of groove 114 and line 124 may provide a clear indication that the connector has been properly assembled.

Figure 2:
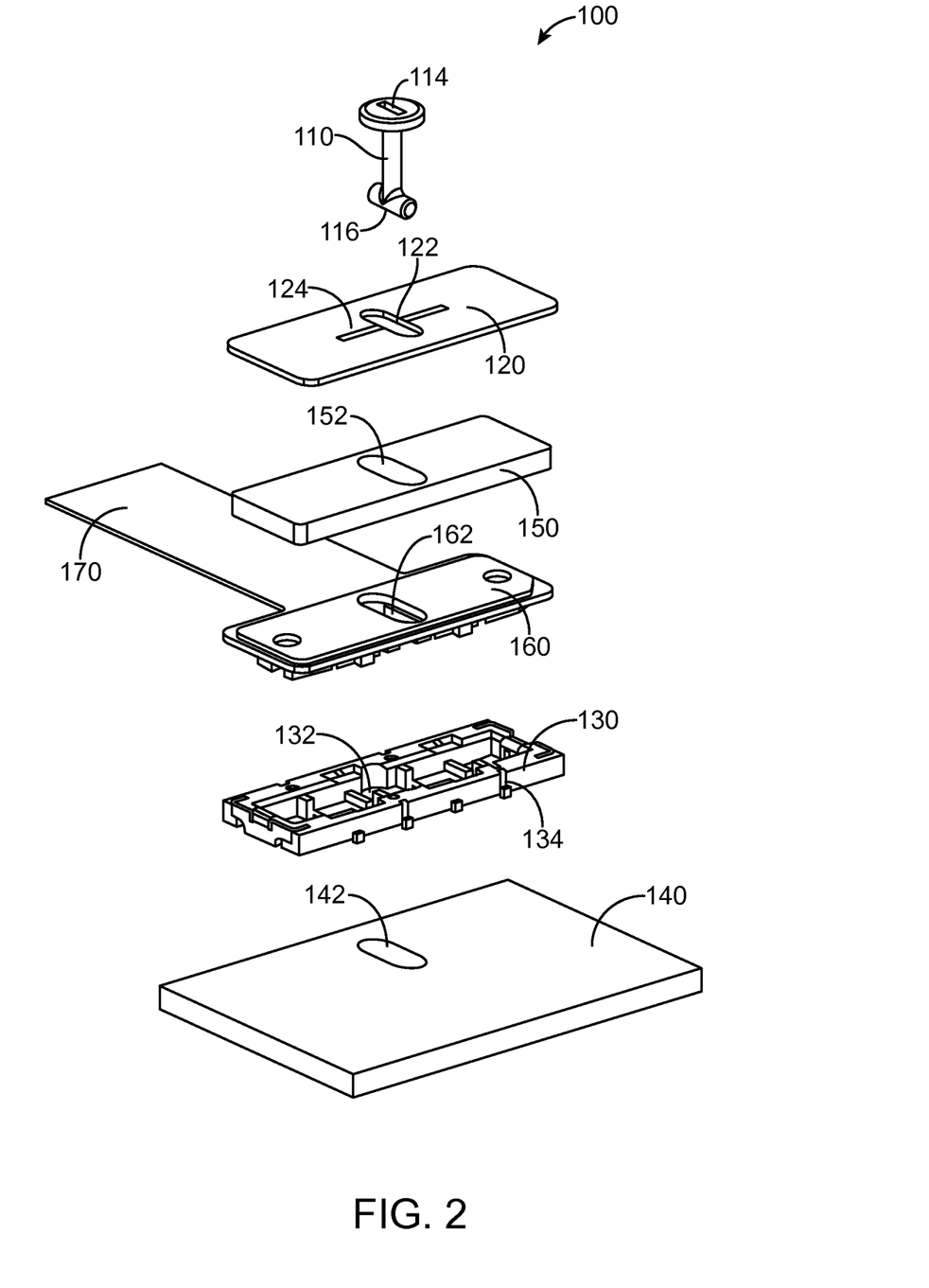
FIG. 2 illustrates an exploded view of a connector assembly according to an embodiment of the present invention.

FIG. 2 illustrates an exploded view of a connector assembly according to an embodiment of the present invention. Connector assembly 100 may include retention key 110. Retention key 110 may include a head having groove 114. Groove 114 may be arranged to accept a tool, such as a screwdriver, that may be used to turn retention key 110. Retention key 110 may further include locking tail 116. Locking tail 116 may be arranged to pass through slots in components of a connector assembly. Retention key 110 may be formed using metal injection molding, 3-D printing, or other technique. Groove 114 may be laser etched in the head of retention key 110.

Board 140 may be a main logic board or other printed circuit board or appropriate substrate. Slot 142 may be formed in board 140 by machining or other processes. Receptacle 130 may include contacts 134. Contacts 134 may form electrical connections with traces on printed circuit board 140. Receptacle 130 may further include a slot area 132 that may be molded into the receptacle. Flexible circuit board 170 may be connected to plug 160. Traces in flexible circuit board 170 may connect to contacts (not shown) on plug 160. These contacts may form electrical connections with contacts 164 on receptacle 130. In this way, conductors in flexible circuit board 170 may connect to traces on printed circuit board 140 via contacts on plug 160 and contacts 164 on receptacle 130. Plug 160 may include slot 162, which may be molded or otherwise formed. A slot may also be formed in flexible circuit board 170, depending on the exact arrangement between flexible circuit board 170 and plug 160 that is employed.

A first pliable layer 150 may be placed on plug 160. First pliable layer 150 may include slot 152. First pliable layer 150 may be formed of foam or other compressible material. Preferably, pliable layer 150 may have good retention properties such that a compression force is applied by pliable layer 150 after assembly to keep retention key 110 in place.

A first stiffening layer or cowling 120 may include slot 122 and may have line 124 etched or printed on a top surface. Cowling 120 may be sheet-metal or other material.

During assembly, receptacle 130 may be fixed to printed circuit board 140. Flexible circuit board 170 may be fixed to plug 160. Plug 160 may be inserted into receptacle 130. First pliable layer 150 may be placed over plug 160. Cowling 120 may be placed over first pliable layer 150. Locking tail 116 of retention key 110 may be inserted through slots 122, 152, 162, and 142. A downward force may be applied to either or both a head of retention key 110 and cowling 120. This force may be applied by hand or by using a tool. This force may compress pliable layer 150 such that locking tail 116 of retention key 110 may emerge through a bottom of slot 142 in printed circuit board 140. Retention key 110 may then be turned approximately 90 degrees, thereby placing locking tail 116 in position on a bottom surface of printed circuit board 140. In this locked state, groove 114 on retention key 110 may be at least approximately aligned with line 124 on cowling 120, thereby indicating that a proper connection has been made.

Figure 3:
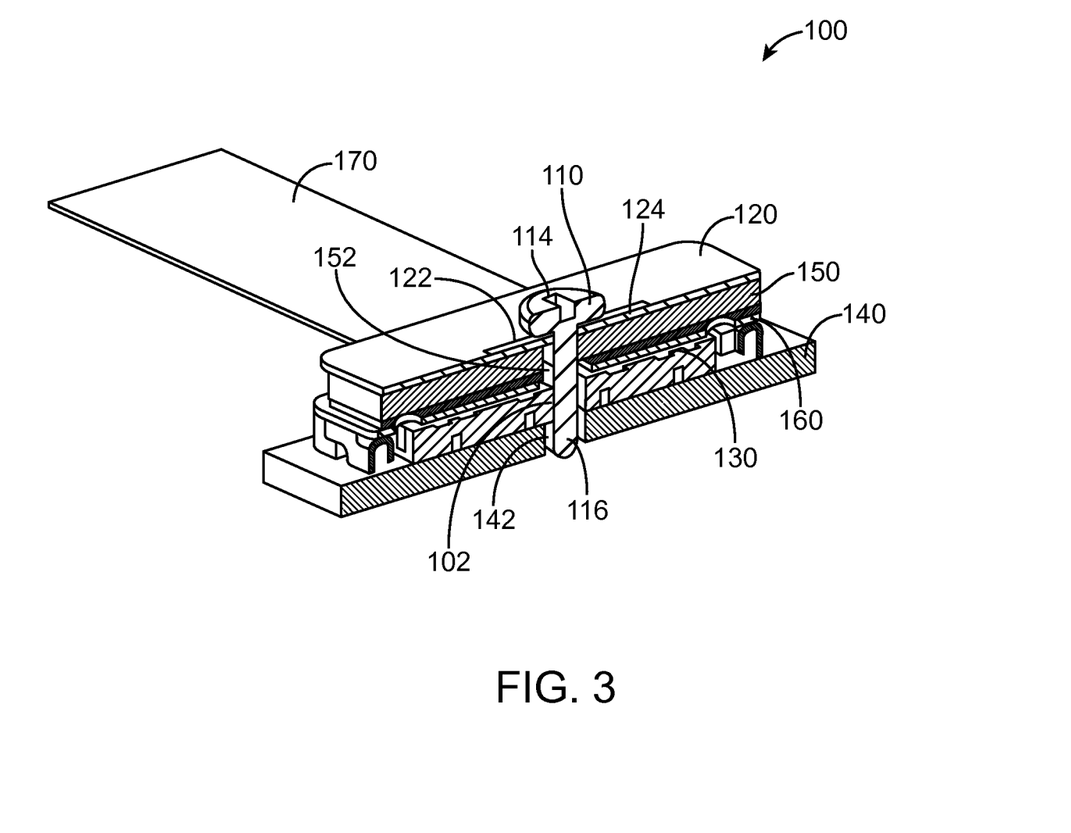
FIG. 3 illustrates a cutaway view of a connector assembly according to an embodiment of the present invention.

FIG. 3 illustrates a cutaway view of a connector assembly according to an embodiment of the present invention. In this example, connector assembly 100 is shown in the unlocked state. Again, connector assembly 100 may include retention key 110 having groove 114 and locking tail 116. Receptacle 130 may reside on board 140. Plug 160 may plug into receptacle 130. First pliable layer 150 and first stiffening layers 120 may reside on top of plug 160. Flexible circuit board 170 may attach to plug 160.

In these examples, flexible circuit board 170 is shown as being attached to printed circuit board 140 through connector assembly 100. In other embodiments the present invention, more than two boards may be connected using a connector assembly. Moreover, these boards may be possible circuit boards, printed circuit boards, or combinations thereof. For example, two or more flexible circuit boards, or to or printed circuit boards, may be connected together by employing embodiments of the present invention.

Figure 4:
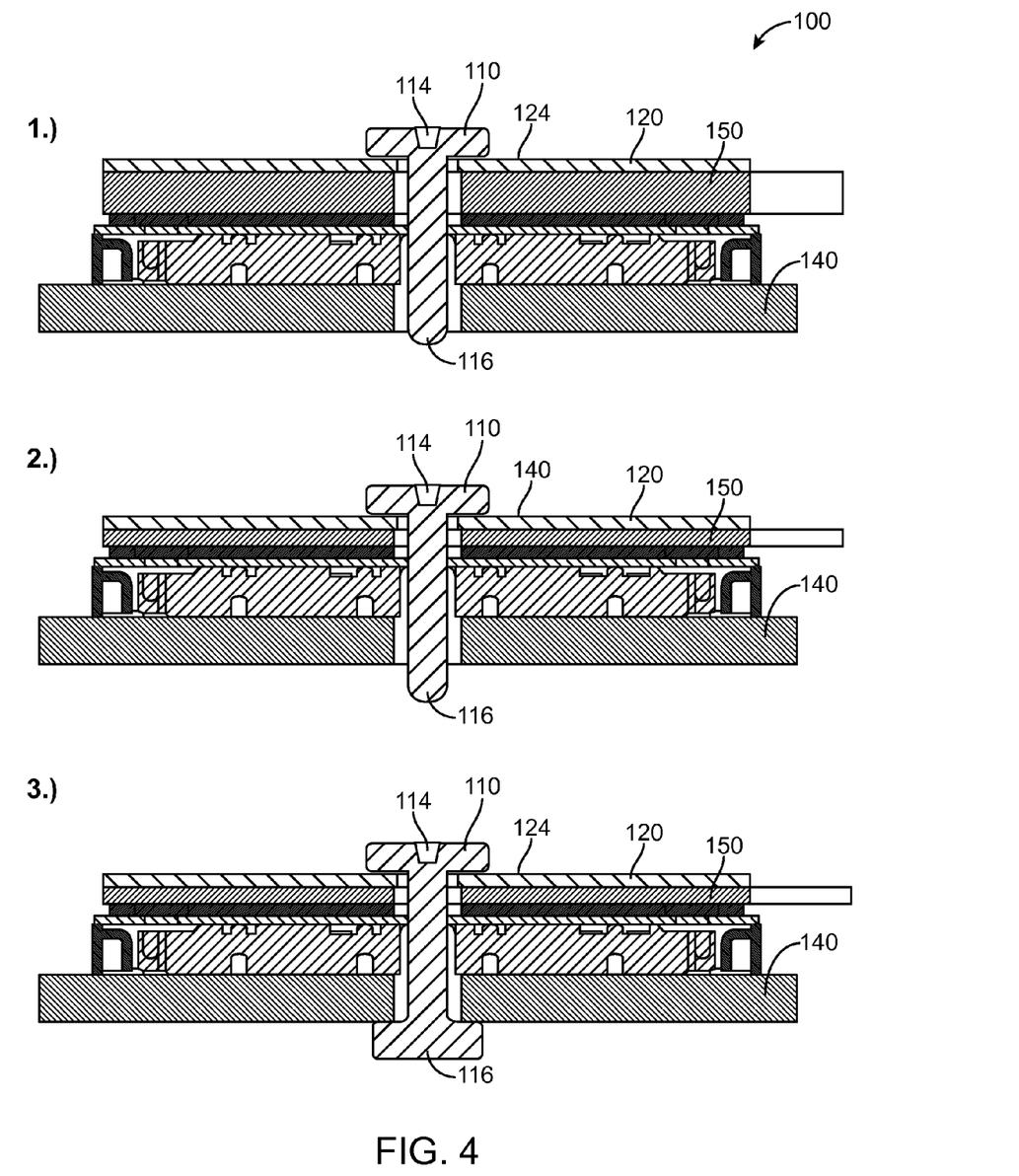
FIG. 4 illustrates a side view of a connector assembly during the insertion and locking of a retention key according to an embodiment of the present invention.

FIG. 4 illustrates a side view of a connector assembly during the insertion and locking of a retention key according to an embodiment of the present invention. In act 1.), retention key 110 may be inserted through slots in the layers of connector assembly 100 including board 140 and first pliable layer 150. In this configuration, groove 114 and line 124 may be approximately at right angles.

In act 2.), a downward force is applied to either or both a head of retention key 110 and cowling 120, thereby compressing first pliable layer 150.

In act 3.), retention key 110 may be turned approximately 90 degrees. Retention key 110 may be turned by fitting a tool in a groove 114 and twisting. This positioning may secure locking tail 116 below a bottom surface of printed circuit board 140. In this configuration, groove 114 of retention key 110 may be at least approximately aligned with line 124 on cowling 120. This may provide a simple visual verification that the connector has been properly assembled. A compression force from first pliable layer 150 may secure or locking tail 116 in place to ensure that retention key 110 does not twist and lead to the disassembly the connector. A groove or notch in a bottom surface of board 140 may further secure locking tail 116 in place.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An apparatus to connect a first board to a second board, the apparatus comprising:
   the second board having a slot;
   a receptacle on the second board having a slot aligned with the slot in the second board;
   a plug connected to the first board, the plug inserted into the receptacle, the plug having a slot aligned with the slot in the receptacle;
   a first pliable layer located on the plug and having a slot aligned with the slot in the plug;
   a first stiffening piece located on the pliable layer and having a slot aligned the slot in the first pliable layer; and
   a retention key having a head in contact with the first stiffening piece, a shaft through the slots in the second board, receptacle, plug, first pliable layer, and first stiffening piece, and a locking tail below the second board and at an angle to the slot in the second board,
   wherein the first board is a flexible circuit board and the second board is a printed circuit board, and
   wherein the receptacle comprises a housing to support a plurality of contacts, where the contacts form electrical connections to traces on the second board.

2. The apparatus of claim 1 wherein the plug includes contacts that form electrical connections to the contacts in the receptacle and traces of the first board.

3. The apparatus of claim 2 wherein the first pliable layer is a piece of foam.

4. The apparatus of claim 3 wherein the first stiffening piece is a metal cowling.

5. The apparatus of claim 4 wherein the angle between the locking tail on the retention key and the slot on the second board is approximately 90 degrees.

6. The apparatus of claim 5 wherein a first grove is formed on the head of the retention pin and a first line is formed on a top surface of the stiffening piece and the first grove and the first line are approximately aligned.

7. The apparatus of claim 5 wherein a first grove is formed on the head of the retention pin and a first line is formed on a top surface of the stiffening piece, and when the angle between the locking tail on the retention key and the slot on the second board is approximately 90 degrees, the first grove and the first line are approximately aligned.

8. The apparatus of claim 5 wherein the retention key may be removed from the apparatus by turning the retention key such that the first grove and the first line are at least approximately at 90 degrees.

9. The apparatus of claim 5 wherein compression of the first pliable layer provides a force to keep the locking tail of the retention key in place.

10. A method of manufacturing an apparatus to connect a first board to a second board, the method comprising:
    providing a slot in the second board;
    attaching a receptacle to the second board, the receptacle having a slot aligned with the slot in the second board;
    connecting a plug to the first board;
    inserting the plug into the receptacle, the plug having a slot aligned with the slot in the receptacle;
    placing a first pliable layer on the plug, the first pliable layer having a slot aligned with the slot in the plug;
    placing a first stiffening piece on the pliable layer, the first stiffening layer having a slot aligned the slot in the first pliable layer; and
    inserting a retention key having a head, a shaft, and a locking tail by:
      aligning the locking tail with the slots in the second board, receptacle, plug, first pliable layer, and first stiffening piece;
      lowering the retention key until the head meets the first stiffening layer;
      compressing the pliable layer until the locking tail emerges from a bottom of the second board; and
      turning the retention key.

11. The method of claim 10 wherein the retention key is turned approximately 90 degrees.

12. The method of claim 11 wherein a first grove is formed on the head of the retention pin and a first line is formed on a top surface of the stiffening piece and after the retention key is turned, the first grove and the first line are approximately aligned.

13. The method of claim 12 wherein the first board is a flexible circuit board and the second board is a printed circuit board.

14. The method of claim 13 wherein the receptacle comprises a housing to support a plurality of contacts, where the contacts form electrical connections to traces on the second board.

15. The method of claim 14 wherein the plug includes contacts that form electrical connections to the contacts in the receptacle and traces of the first board.

16. The method of claim 15 wherein the first pliable layer is a piece of foam.

17. The method of claim 16 wherein the first stiffening piece is a metal cowling.

18. The method of claim 12 wherein the first grove and the first line are laser etched.

19. The method of claim 12 further comprising forming the retention key using metal-injection molding.

20. The method of claim 12 wherein the compression of the first pliable layer provides a force to keep the locking tail of the retention key in place.

21. An apparatus to connect a first board to a second board, the apparatus comprising:
    the second board having a slot;
    a receptacle on a top surface of the second board having a slot aligned with the slot in the second board;
    a plug attached to the first board, the plug inserted into the receptacle, the plug having a slot aligned with the slot in the receptacle;
    a first stiffening piece over the plug and having a slot aligned the slot in the plug;
    a first layer of compressible material located between the plug and the first stiffening piece and having a slot aligned with the slot in the plug; and
    a retention key having a head in contact with the first stiffening piece, a shaft through the slots in the second board, receptacle, plug, first layer of compressible material, and first stiffening piece, and a locking tail orthogonal to the shaft and below the second board and at an angle to the slot in the second board,
    wherein the first board is a flexible circuit board and the second board is a printed circuit board, and
    wherein the receptacle comprises a housing to support a plurality of contacts, where the contacts form electrical connections to traces on the second board.

22. The apparatus of claim 21 wherein the first layer of compressible material is a piece of foam.

* * * * *

UNITED STATES PATENT AND TRADEMARK OFFICE
CERTIFICATE OF CORRECTION

PATENT NO.         : 9,225,115 B2
APPLICATION NO.    : 13/913337
DATED              : December 29, 2015
INVENTOR(S)        : Shayan Malek et al.

Page 1 of 1

It is certified that error appears in the above-identified patent and that said Letters Patent is hereby corrected as shown below:

In the Title Page item (72) Inventors, please make the corrections as shown below:

Delete "Astoush Y. Shukla" and insert --Ashutosh Y. Shukla--.

Signed and Sealed this
Fifteenth Day of March, 2016

Michelle K. Lee
*Director of the United States Patent and Trademark Office*